(12) United States Patent
Herner et al.

(10) Patent No.: US 7,982,209 B2
(45) Date of Patent: Jul. 19, 2011

(54) MEMORY CELL COMPRISING A CARBON NANOTUBE FABRIC ELEMENT AND A STEERING ELEMENT

(75) Inventors: S. Brad Herner, San Jose, CA (US); Roy E. Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 384 days.

(21) Appl. No.: 11/692,148

(22) Filed: Mar. 27, 2007

(65) Prior Publication Data

US 2008/0237599 A1 Oct. 2, 2008

(51) Int. Cl.
*H01L 29/06* (2006.01)
(52) U.S. Cl. ............ 257/14; 257/30; 257/428; 257/530; 257/473; 257/656
(58) Field of Classification Search ............ 257/14, 257/30, 428, 473, 530, 656
See application file for complete search history.

(56) References Cited

U.S. PATENT DOCUMENTS

| | | | |
|---|---|---|---|
| 5,915,167 A | 6/1999 | Leedy | |
| 6,034,882 A | 3/2000 | Johnson et al. | |
| 6,643,165 B2 | 11/2003 | Segal et al. | |
| 6,858,481 B2 | 2/2005 | Krieger et al. | |
| 6,946,719 B2 | 9/2005 | Petti et al. | |
| 6,952,030 B2 | 10/2005 | Herner et al. | |
| 7,112,464 B2 | 9/2006 | Jaiprakash | |
| 7,172,840 B2 | 2/2007 | Chen | |
| 7,176,064 B2 | 2/2007 | Herner | |
| 7,335,395 B2 | 2/2008 | Ward et al. | |
| 7,345,505 B2 | 3/2008 | Madurawe | |
| 7,405,465 B2 | 7/2008 | Herner | |
| 7,575,984 B2 | 8/2009 | Radigan | |
| 2005/0052915 A1 | 3/2005 | Herner et al. | |
| 2005/0158950 A1 | 7/2005 | Scheuerlein et al. | |
| 2005/0221200 A1 | 10/2005 | Chen | |
| 2005/0226067 A1 | 10/2005 | Herner et al. | |
| 2006/0250836 A1 | 11/2006 | Herner et al. | |
| 2006/0250837 A1 | 11/2006 | Herner et al. | |
| 2006/0273298 A1 | 12/2006 | Petti | |
| 2007/0018260 A1 | 1/2007 | Jaiprakash et al. | |

(Continued)

FOREIGN PATENT DOCUMENTS

WO    WO 2006/085902 A2    8/2006

(Continued)

OTHER PUBLICATIONS

Zhirnov, et al., "Chemistry of Molecules or Physics of Contacts?", News and Views, Nature Materials (Jan. 2006), pp. 11-12, vol. 5.

(Continued)

*Primary Examiner* — Long Pham
(74) *Attorney, Agent, or Firm* — Dugan & Dugan, PC

(57) ABSTRACT

A rewritable nonvolatile memory cell is disclosed comprising a steering element in series with a carbon nanotube fabric. The steering element is preferably a diode, but may also be a transistor. The carbon nanotube fabric reversibly changes resistivity when subjected to an appropriate electrical pulse. The different resistivity states of the carbon nanotube fabric can be sensed, and can correspond to distinct data states of the memory cell. A first memory level of such memory cells can be monolithically formed above a substrate, a second memory level monolithically formed above the first, and so on, forming a highly dense monolithic three dimensional memory array of stacked memory levels.

29 Claims, 5 Drawing Sheets

U.S. PATENT DOCUMENTS

| | | | |
|---|---|---|---|
| 2007/0063740 A1 | 3/2007 | Bertin et al. | |
| 2007/0132049 A1 | 6/2007 | Stipe | |
| 2007/0146012 A1* | 6/2007 | Murphy et al. | 326/99 |
| 2007/0158697 A1 | 7/2007 | Choi et al. | |
| 2007/0190722 A1 | 8/2007 | Herner | |
| 2007/0268042 A1 | 11/2007 | Paul | |
| 2008/0239787 A1 | 10/2008 | Herner | |
| 2008/0239790 A1 | 10/2008 | Herner et al. | |
| 2009/0166610 A1 | 7/2009 | Schricker et al. | |
| 2010/0142255 A1 | 6/2010 | Herner et al. | |

FOREIGN PATENT DOCUMENTS

| | | | |
|---|---|---|---|
| WO | WO 2006/121837 | A2 | 11/2006 |
| WO | WO 2006122111 | A2 | 11/2006 |
| WO | WO 2006/130800 | A2 | 12/2006 |
| WO | WO 2008/021900 | A3 | 2/2008 |

OTHER PUBLICATIONS

Kumar, et al., U.S. Appl. No. 11/496,986, filed Jul. 31, 2006, entitled "Method for Using a Memory Cell Comprising Switchable Semiconductor Memory Element with Trimmable Resistance," not yet published.

Herner, U.S. Appl. No. 11/560,283, filed Nov. 15, 2006, entitled "Method for Making a P-I-N Diode Crystallized Adjacent to a Silicide in Series with a Dielectric Antifuse," not yet published.

International Search Report and Written Opinion of International Application No. PCT/US2008/004018 mailed Sep. 4, 2008.

Sep. 22, 2008 Office Action of U.S. Appl. No. 11/692,144.

Mar. 11, 2009 Final Office Action of U.S. Appl. No. 11/692,144.

Notice of Allowance of U.S. Appl. No. 11/692,144, mailed Jul. 14, 2009.

Jun. 8, 2009 Reply to Mar. 11, 2009 Final Office Action of related U.S. Appl. No. 11/692,144.

Jan. 22, 2009 Reply to Sep. 22, 2008 Office Action of related U.S. Appl. No. 11/692,144.

Notice of Allowance of related U.S. Appl. No. 11/692,144 mailed Oct. 19, 2009.

Smith et al., "Polishing TiN for Nanotube Synthesis", Proceedings of the 16th Annual Meeting of the American Society for Precision Engineering, Nov. 10-15, 2001.

Rao et al., "In situ-grown carbon nanotube array with excellent field emission characteristics", Appl. Phys. Lett., vol. 76, No. 25, Jun. 19, 2000, pp. 3813-.3815.

Oct. 28, 2010 Reply to related Office Action of U.S. Appl. No. 12/693,782 mailed Jul. 27, 2010.

Office Action of related Chinese Patent Application No. 200880016582.5 issued Sep. 27, 2010.

Notice of Allowance of related U.S. Appl. No. 12/693,782 mailed Dec. 2, 2010.

Feb. 12, 2011 Reply to Sep. 27, 2010 Office Action of related Chinese Patent Application No. 200880016582.5.

Claim Amendments as submitted with Request for Examination of related Japanese Patent Application No. 2010-500999 filed Mar. 1, 2011.

* cited by examiner

MEMORY CELL COMPRISING A CARBON NANOTUBE FABRIC ELEMENT AND A STEERING ELEMENT

RELATED APPLICATIONS

This application is related to Herner et al., U.S. patent application Ser. No. 11/692,144, "Method to Form a Memory Cell Comprising a Carbon Nanotube Fabric Element and a Steering Element"; to Herner, U.S. patent application Ser. No. 11/692,151, "Method to Form Upward-Pointing P-I-N Diodes Having Large and Uniform Current"; and to Herner, U.S. patent application Ser. No. 11/692,153, "Large Array of Upward-Pointing P-I-N Diodes Having Large and Uniform Current," all filed on even date herewith and all hereby incorporated by reference in their entirety.

BACKGROUND OF THE INVENTION

Carbon nanotube memories are believed to operate by flexing of individual carbon nanotubes or carbon nanotube ribbons in an electric field. This flexing mechanism requires space within which the carbon nanotubes can flex. In nanotechnologies, forming and maintaining such an empty space is extremely difficult.

It would be advantageous to form a memory cell using carbon nanotubes which is readily fabricated. It would further be advantageous to form such a memory cell in a highly dense, very large cross-point array.

SUMMARY OF THE PREFERRED EMBODIMENTS

The present invention is defined by the following claims, and nothing in this section should be taken as a limitation on those claims. In general, the invention is directed to a memory array in which memory cells comprise carbon nanotube fabric and a steering element, such as a diode or a transistor, arranged electrically in series.

A first aspect of the invention provides for a memory cell comprising: a first conductor; a steering element; a carbon nanotube fabric; and a second conductor, wherein the steering element and the carbon nanotube fabric are arranged electrically in series between the first conductor and the second conductor, and wherein the entire memory cell is formed above a substrate.

A preferred embodiment of the invention calls for a monolithic three dimensional memory array comprising: a first memory level monolithically formed above a substrate, the first memory level comprising: i) a plurality of first substantially parallel, substantially coplanar bottom conductors; ii) a plurality of steering elements; iii) a plurality of first-level carbon nanotube fabric elements, and iv) a plurality of first substantially parallel, substantially coplanar top conductors; and v) a plurality of first-level memory cells, wherein each first-level memory cell comprises one of the steering elements and one of the first-level carbon nanotube fabric elements arranged electrically in series between one of the first bottom conductors and one of first top conductors; and (b) a second memory level monolithically formed above the first memory level.

Each of the aspects and embodiments of the invention described herein can be used alone or in combination with one another.

The preferred aspects and embodiments will now be described with reference to the attached drawings.

BRIEF DESCRIPTION OF THE DRAWINGS

FIGS. 3a and 3c show the same structure at perpendicular views, while

DETAILED DESCRIPTION OF THE PREFERRED EMBODIMENTS

Figure 1:
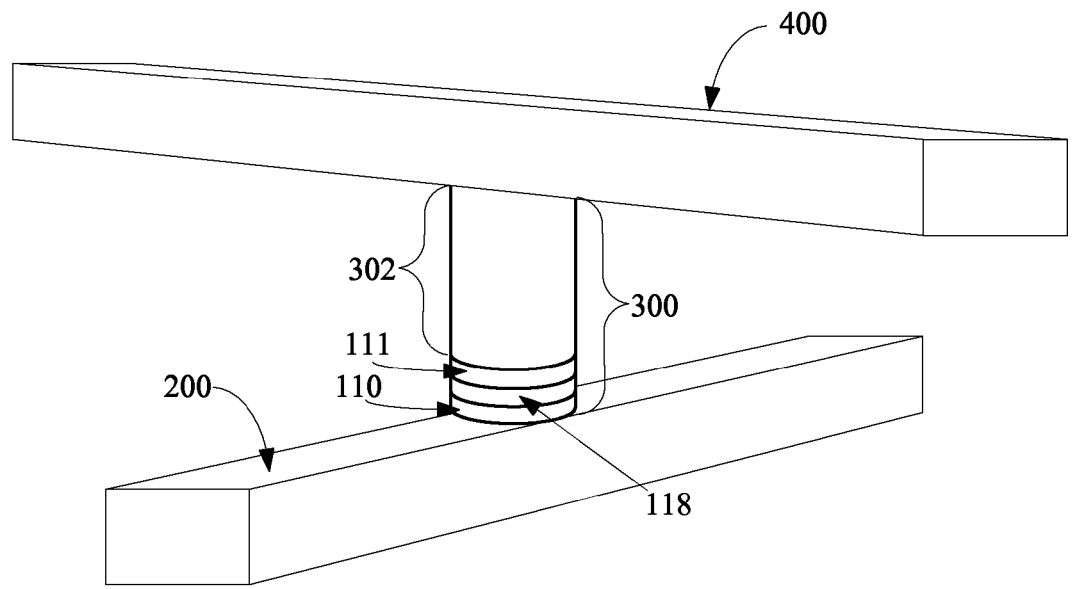
FIG. 1 is a perspective view of a memory cell formed according to a preferred embodiment of the present invention.

A carbon nanotube is a hollow cylinder of carbon, typically a rolled sheet a single carbon atom thick. Carbon nanotubes typically have a diameter of about 1-2 nm and length hundreds or thousands of times greater.

Nonvolatile memories retain information even when power to the device is turned off. A nonvolatile memory cell using carbon nanotubes is described in, for example, Segal et al., U.S. Pat. No. 6,643,165, "Electromechanical memory having cell selection circuitry constructed with nanotube technology," and in Jaiprakash et al., U.S. Pat. No. 7,112,464, "Devices having vertically-disposed nanofabric articles and methods of making the same."

In both Segal et al. and Jaiprakash et al., a carbon nanotube element (either a single carbon nanotube or a carbon nanotube ribbon of multiple tubes) is spatially separate from an electrode, the carbon nanotube element either horizontally oriented and suspended above an electrode, or vertically oriented and adjacent to a vertically oriented electrode. The memory cell operates by exposing the carbon nanotube element to an electric charge, causing the carbon nanotube element to mechanically flex, making electrical contact with the electrode. These two electrical states of the memory cell, with the carbon nanotube element either in contact or not in contact with the adjacent electrode, can be sensed, remain when power is removed to the device, and correspond to two distinguishable data states of the memory cell.

As the mechanism relies on movement of the carbon nanotube element, a structure must be fabricated with a gap between the carbon nanotube element and the adjacent electrode to allow such movement. Fabrication of such a gap is difficult at very small dimensions, and will become more so as dimensions continue to shrink.

In the present invention, a nonvolatile memory cell is formed using a carbon nanotube fabric. The term carbon nanotube fabric will be used herein to describe a contiguous plurality of carbon nanotubes with no required orientation of the individual tubes, in contrast to a carbon nanotube ribbon, in which the nanotubes must be substantially parallel. In preferred embodiments, such a carbon nanotube fabric includes several or many layers of carbon nanotubes at random orientations. Operation of the cell does not require creation of open space within which individual nanotubes can flex, and thus will be more robust and simpler to fabricate.

It is expected that carbon nanotube fabric will exhibit resistivity switching behavior; i.e. the fabric will change its resistivity when subjected to sufficient voltage or current. A switch from higher resistivity to lower resistivity will be referred to as a set transition, which is achieved by an electrical set pulse, while a reset transition, from lower resistivity to higher resistivity, is achieved by an electrical reset pulse. The terms set voltage, set current, reset voltage, and reset current will also be used.

Summarizing, then, in one embodiment, the cell includes a steering element and a carbon nanotube fabric arranged electrically in series between a first conductor and a second conductor. The carbon nanotube fabric may be in a first state, having a first resistivity. After application of a first electrical set pulse between the first conductor and the second conductor, the carbon nanotube fabric has a second resistivity, the second resistivity less than the first resistivity. Next, after application of a first electrical reset pulse across the steering element and the carbon nanotube fabric, the carbon nanotube fabric has a third resistivity, the third resistivity greater than the second resistivity. The data state of the memory cell can be stored in any of these resistivity states. A read voltage is applied after application of the first set pulse, or application of the first reset pulse, to sense the data state.

FIG. 1 shows an embodiment of the present invention. Carbon nanotube fabric 118 and diode 302 are disposed electrically in series between bottom conductor 200 and top conductor 400. Optional conductive barrier layers 110 and 111 sandwich carbon nanotube fabric 118. In one embodiment, when this memory cell is formed, carbon nanotube fabric 118 is in a first resistivity state, for example a high-resistivity or reset state. In the reset state, when a read voltage is applied between top conductor 400 and bottom conductor 200, little or no current flows between the conductors. After application of a set pulse, the resistivity of carbon nanotube fabric 118 undergoes a set transition to the set state, which is a low-resistivity state. With carbon nanotube fabric 118 in the set state, when the same read voltage is applied between top conductor 400 and bottom conductor 200, significantly more current flows between them. After application of a reset pulse, the resistivity of carbon nanotube fabric 118 undergoes a reset transition, returning to a high-resistivity reset state. When read voltage is applied between top conductor 400 and bottom conductor 200, significantly less current flows between them. The different current under applied read voltage between the set state and the reset state can be reliably sensed. These different states can respond to distinct data states of a memory cell; for example one resistivity state may correspond to a data "0" while another corresponds to a data "1". In an alternative embodiment, the initial state of carbon nanotube fabric 118 may be a low-resistivity state. For simplicity, two data states will be described. It will be understood by those skilled in the art, however, that three, four, or more reliably distinguishable resistivity states may be achieved in some embodiments.

Figure 2:
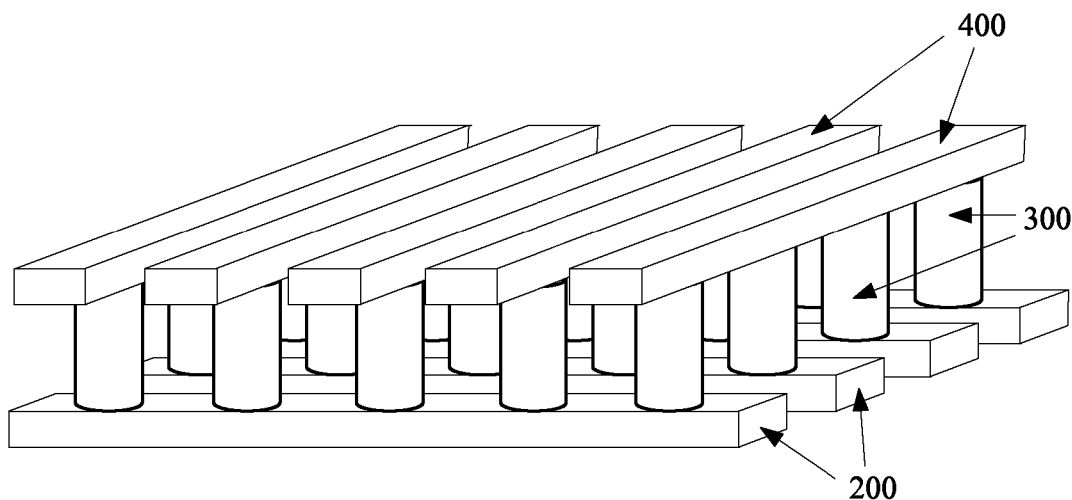
FIG. 2 is a perspective view of a portion of a first memory level comprising memory cells like those shown in FIG. 1.

FIG. 2 shows a plurality of bottom conductors 200 and top conductors 400, with intervening pillars 300, the pillars 300 comprising diodes and carbon nanotube fabric elements. In an alternative embodiment, the diode could be replaced with some other non-ohmic device. In this way a first level of memory cells can be formed; only a small portion of such a memory level is shown here. In preferred embodiments, additional memory levels can be formed stacked above this first memory level, forming a highly dense monolithic three dimensional memory array. The memory array is formed of deposited and grown layers above a substrate, for example a monocrystalline silicon substrate. Support circuitry is advantageously formed in the substrate below the memory array.

An alternative embodiment of the present invention uses a structure described in Petti et al., U.S. patent application Ser. No. 11/143,269, "Rewriteable Memory Cell Comprising a Transistor and Resistance-Switching Material in Series," filed Jun. 2, 2005, assigned to the assignee of the present invention and hereby incorporated by reference. Petti et al. describe a memory cell having a layer of a resistivity-switching binary metal oxide or nitride formed in series with a MOS transistor. In embodiments of Petti et al., the MOS transistor is a thin-film transistor, having its channel layer formed in deposited polycrystalline semiconductor material rather than in a monocrystalline wafer substrate.

Figure 3A:
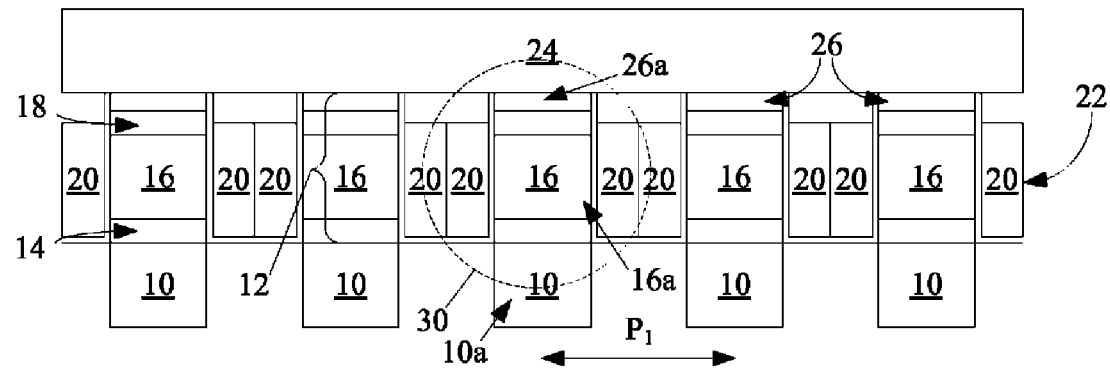
FIGS. 3a and 3c are cross-sectional views showing a memory array formed according to an embodiment of the present invention.

Turning to FIG. 3a, in a preferred embodiment of Petti et al. a plurality of substantially parallel data lines 10 is formed. Semiconductor pillars 12 are formed, each above one of the data lines 10. Each pillar 12 includes heavily doped regions 14 and 18 which serve as drain and source regions, and a lightly doped region 16 which serves as a channel region. A gate electrode 20 surrounds each pillar 12.

Figure 3B:
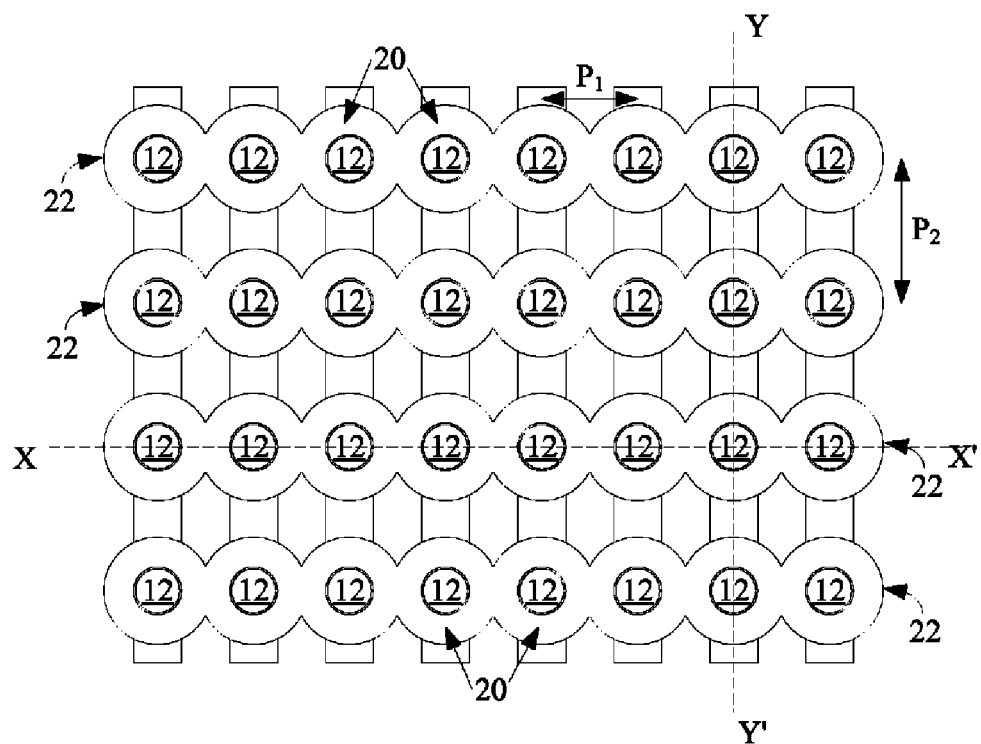
FIG. 3b shows a plan view of this structure.

FIG. 3b shows the cells of FIG. 3a viewed from above. In a repeating pattern, pitch is the distance between a feature and the next occurrence of the same feature. For example, the pitch of pillars 12 is the distance between the center of one pillar and the center of the adjacent pillar. In one direction pillars 12 have a first pitch $P_1$, while in other direction, pillars 12 have a larger pitch $P_2$; for example $P_2$ may be 1.5 times larger than $P_1$. (Feature size is the width of the smallest feature or gap formed by photolithography in a device. Stated another way, pitch $P_1$ may be double the feature size, while pitch $P_2$ is three times the feature size.) In the direction having the smaller pitch $P_1$, shown in FIG. 3a, the gate electrodes 20 of adjacent memory cells merge, forming a single select line 22. In the direction having larger pitch $P_2$, gate electrodes 20 of adjacent cells do not merge, and adjacent select lines 22 are isolated. FIG. 3a shows the structure in cross-section along line X-X' of FIG. 3b, while FIG. 3c shows the structure in cross-section along line Y-Y' of FIG. 3b.

Figure 3C:
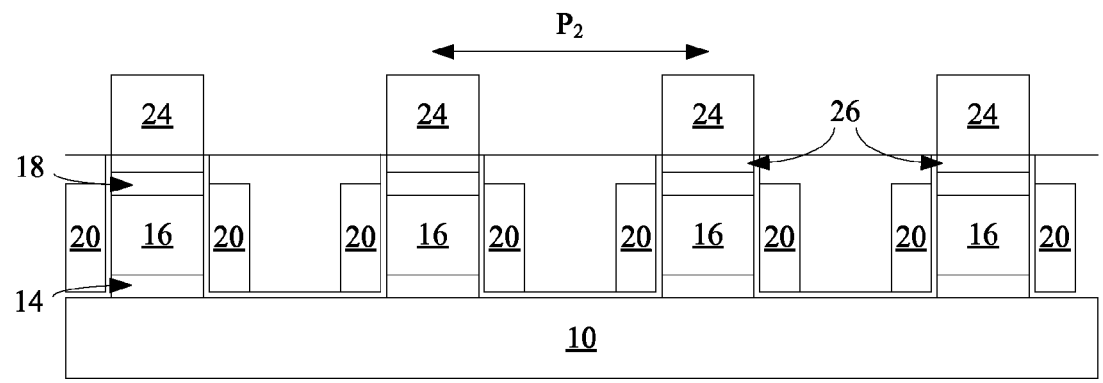

Referring to FIGS. 3a and 3c, reference lines 24, preferably perpendicular to data lines 10, are formed above the pillars 12, such that each pillar 12 is vertically disposed between one of the data lines 10 and one of the reference lines 24. A resistance-switching memory element 26 is formed in each memory cell between source region 18 and reference line 24, for example. Alternatively, resistance-switching memory element 26 can be formed between drain region 14 and data line 10. In preferred embodiments of the present invention, resistance-switching element 26 comprises a layer of carbon nanotube fabric. Note that in the embodiment of FIGS. 3a-3c, the carbon nanotube fabric is at the top of the pillar rather than below it.

Figure 4:
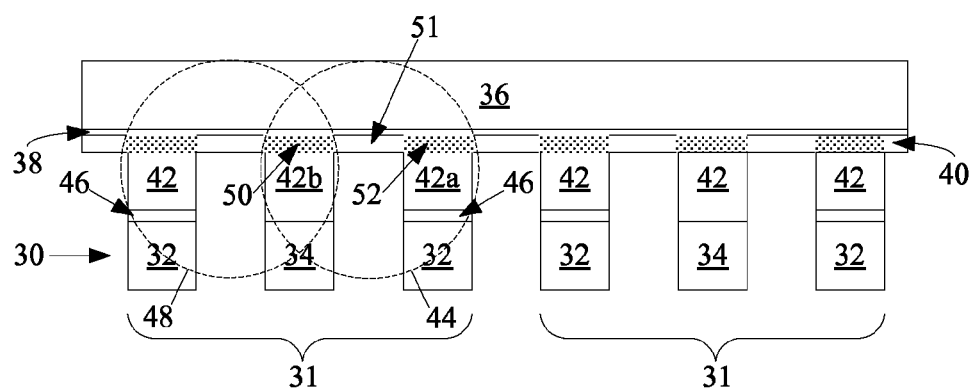
FIG. 4 is a cross-sectional view of another embodiment of the present invention.

FIG. 4 illustrates another embodiment of Petti et al. This embodiment similarly includes memory cells in a TFT array, each having a transistor and a reversible resistance-switching memory element in series, but has a different structure. Substantially parallel rails 30 (shown in cross section, extending out of the page) include a plurality of line sets 31, each line set 31 consisting of two data lines 32 and one reference line 34, reference line 34 immediately adjacent to and between the two data lines 32. Above the rails 30 and preferably extending perpendicular to them, are substantially parallel select lines 36. Select lines 36 are coextensive with gate dielectric layer 38 and channel layer 40. The memory level includes pillars 42, each pillar 42 vertically disposed between one of the channel layers 40 and one of the data lines 32 or one of the reference lines 34. Transistors are formed comprising adjacent pillars along the same select line. Transistor 44 includes channel region 51 between source region 50 and drain region 52. One pillar 42a includes resistance-switching element 46, while the other pillar 42b does not. In this embodiment, adjacent transistors share a reference line; for example transistor 48 shares a reference line 34 with transistor 44. No transistor exists between adjacent data lines 32. In a preferred embodiment of the present invention, resistance-switching element 46 comprises a layer of carbon nanotube fabric.

In the embodiments of FIG. 1 and FIGS. 3a-3c and FIG. 4, the carbon nanotube fabric is paired with a diode or a transistor. A diode and a transistor share the characteristic of non-ohmic conduction. An ohmic conductor, like a wire, conducts current symmetrically, and current increases linearly with voltage according to Ohm's law. A device that does not follow these rules exhibits non-ohmic conduction, and will be described as a steering element. By pairing a steering element with a carbon nanotube fabric, memory cells can be formed in a large cross-point array. The steering element provides electrical isolation between adjacent cells such that a selected cell can be set, reset, or sensed without inadvertently setting or resetting cells sharing a wordline or bitline with the selected cell.

Each of these embodiments includes a first conductor; a steering element; a carbon nanotube fabric; and a second conductor, wherein the steering element and the carbon nanotube fabric are arranged electrically in series between the first conductor and the second conductor, and wherein the entire memory cell is formed above a substrate.

These embodiments are provided as examples; others can be envisioned and fall within the scope of the invention.

As described in Herner et al., U.S. patent application Ser. No. 11/148,530, "Nonvolatile Memory Cell Operating by Increasing Order in Polycrystalline Semiconductor Material," filed Jun. 8, 2005, hereby incorporated by reference, when deposited amorphous silicon is crystallized in contact solely with materials with which it has a high lattice mismatch, such as silicon dioxide and titanium nitride, the polycrystalline silicon or polysilicon forms with a high number of crystalline defects, causing it to be high-resistivity. Application of a programming pulse through this high-defect polysilicon apparently alters the polysilicon, causing it to be lower-resistivity.

As described further in Herner et al., U.S. patent application Ser. No. 10/955,549, "Nonvolatile Memory Cell Without a Dielectric Antifuse Having High- and Low-Impedance States," filed Sep. 29, 2004; in Herner, U.S. Pat. No. 7,176,064, "Memory Cell Comprising a Semiconductor Junction Diode Crystallized Adjacent to a Silicide," both hereby incorporated by reference, it has been found that when deposited amorphous silicon is crystallized in contact with a layer of an appropriate silicide, for example titanium silicide or cobalt silicide, the resulting crystallized silicon is much higher quality, with fewer defects, and has much lower resistivity. The lattice spacing of titanium silicide or cobalt silicide is very close to that of silicon, and it is believed that when amorphous silicon is crystallized in contact with a layer of an appropriate silicide at a favorable orientation, the silicide provides a template for crystal growth of silicon, minimizing formation of defects. Unlike the high-defect silicon crystallized adjacent only to materials with which it has a high lattice mismatch, application of a large electrical pulse does not appreciably change the resistivity of this low-defect, low-resistivity silicon crystallized in contact with the silicide layer.

Referring to FIG. 1, in a preferred embodiment, diode 302 is preferably a junction diode. The term junction diode is used herein to refer to a semiconductor device with the property of conducting current more easily in one direction than the other, having two terminal electrodes, and made of semiconducting material which is p-type at one electrode and n-type at the other. Examples include p-n diodes, which have p-type semiconductor material and n-type semiconductor material in contact, and p-i-n diodes, in which intrinsic (undoped) semiconductor material is interposed between p-type semiconductor material and n-type semiconductor material. In the embodiment of FIG. 1, diode 302 is preferably formed of silicon and the bottom layer of top conductor 400 is a silicide-forming metal such as titanium or cobalt. An anneal causes the silicon of diode 302 to react with the silicide-forming metal, forming a layer of a silicide such as titanium silicide or cobalt silicide, which provides a crystallization template for the silicon of diode 302, causing it to be formed of high-quality, low-resistivity silicon. Thus a set or reset pulse applied between conductor 400 and 200 serves only to switch the resistivity state of carbon nanotube fiber 118, and not to change the resistivity of the silicon of diode 302. This makes set and reset transitions more controllable and predictable, and may serve to reduce the amplitude of the pulse required. In other embodiments, the silicon of diode 302 may be deposited amorphous and may be crystallized adjacent only with materials with which it has a high lattice mismatch, and thus may formed of be high-defect, high-resistivity polysilicon.

This discussion has described a diode formed of silicon crystallized in contact with an appropriate silicide. Silicon and germanium are fully miscible, and the lattice spacing of germanium is very close to that of silicon. It is expected that alloys of amorphous silicon-germanium crystallized in contact with an appropriate silicide-germanide (such as titanium silicide-germanide or cobalt silicide-germanide) will similarly crystallize to form low-defect, low-resistivity polysilicon-polygermanium.

The preferred diode in the present invention is a vertically oriented p-i-n diode, having a bottom heavily doped region of a first conductivity type, a middle intrinsic or lightly doped region, and a top heavily doped silicon of a second conductivity type opposite the first.

A detailed example will be provided describing fabrication of two memory levels formed above a substrate, the memory levels comprising memory cells having a diode and a carbon nanotube fabric element arranged in series between a bottom conductor and a top conductor. Details from Herner, U.S. patent application Ser. No. 11/560,283, "P-I-N Diode Crystallized Adjacent to a Silicide in Series with a Dielectric Antifuse," filed Nov. 15, 2006, hereby incorporated by reference, may prove useful in fabrication of this memory level. To avoid obscuring the invention, not all details from this or other incorporated documents will be included, but it will be understood that no teaching of these applications and patents is intended to be excluded. For completeness, many details, including materials, steps, and conditions, will be provided, but it will be understood by those skilled in the art that many of these details can be changed, augmented or omitted while the results fall within the scope of the invention.

EXAMPLE

Figure 5A:
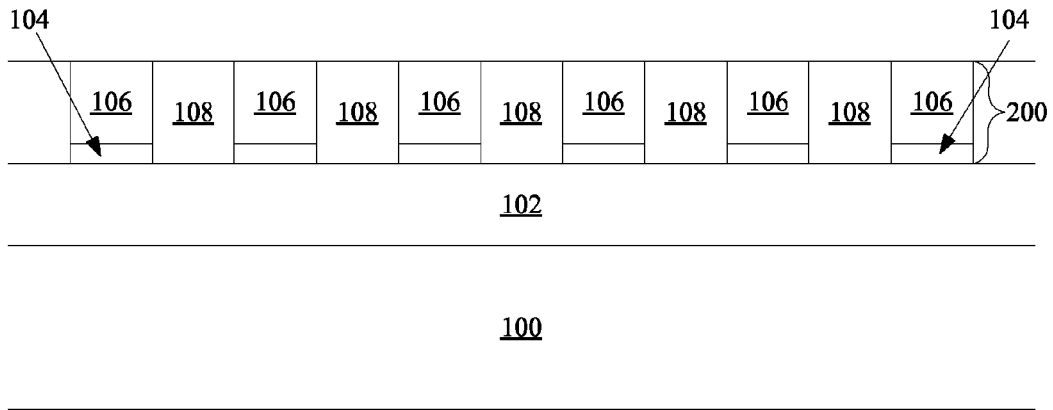
FIGS. 5a-5d are cross-sectional views illustrating stages in formation of two monolithically formed memory levels of a monolithic three dimensional memory array formed according to a preferred embodiment of the present invention.

Turning to FIG. 5a, formation of the memory begins with a substrate 100. This substrate 100 can be any semiconducting substrate known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, Si—C—O—H film, or any other suitable insulating material.

The first conductors 200 are formed over the substrate 100 and insulator 102. An adhesion layer 104 may be included between the insulating layer 102 and the conducting layer 106 to help conducting layer 106 adhere to insulating layer 102. If the overlying conducting layer 106 is tungsten, titanium nitride is preferred as adhesion layer 104. Conducting layer 106 can comprise any conducting material known in the art, such as tungsten, or other materials, including tantalum, titanium, or alloys thereof.

Once all the layers that will form the conductor rails have been deposited, the layers will be patterned and etched using any suitable masking and etching process to form substantially parallel, substantially coplanar conductors 200, shown in FIG. 5a in cross-section. Conductors 200 extend out of the page. In one embodiment, photoresist is deposited, patterned by photolithography and the layers etched, and then the photoresist removed using standard process techniques.

Next a dielectric material 108 is deposited over and between conductor rails 200. Dielectric material 108 can be any known electrically insulating material, such as silicon oxide, silicon nitride, or silicon oxynitride. In a preferred embodiment, silicon dioxide deposited by a high-density plasma method is used as dielectric material 108.

Finally, excess dielectric material 108 on top of conductor rails 200 is removed, exposing the tops of conductor rails 200 separated by dielectric material 108, and leaving a substantially planar surface. The resulting structure is shown in FIG. 5a. This removal of dielectric overfill to form the planar surface can be performed by any process known in the art, such as chemical mechanical planarization (CMP) or etchback. In an alternative embodiment, conductors 200 could be formed by a Damascene method instead.

Figure 5B:
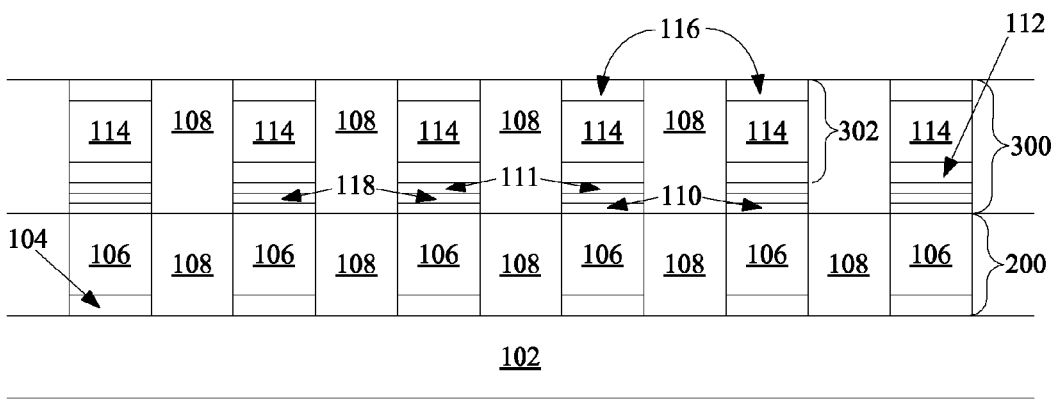

Turning to FIG. 5b, next optional conductive layer 110 is deposited. Layer 110 is a conductive material, for example titanium nitride, tantalum nitride, or tungsten. This layer may be any appropriate thickness, for example about 50 to about 200 angstroms, preferably about 100 angstroms. In some embodiments barrier layer 110 may be omitted.

Next a thin layer 118 of carbon nanotube fabric is formed using any conventional method. (For simplicity substrate 100 is omitted from FIG. 5b and succeeding figures; its presence will be assumed.) In some embodiments this layer can be formed by spin casting or spray coating a solution including carbon nanotubes; such solutions are commercially available. Carbon nanotube fabric layer 118 is preferably between about 2 nm and about 500 nm thick, most preferably between about 4 and about 40 nm thick.

Conductive layer 111 is deposited on layer 118. It can be any appropriate conductive material, for example titanium nitride, with any appropriate thickness, for example about 50 to about 200 angstroms, preferably about 100 angstroms. In some embodiments conductive layer 111 may be omitted.

Conductive layers 110 and 111, which are immediately below and immediately above carbon nanotube fabric 118, respectively, and in permanent contact with it, will serve as electrodes, and may aid in resistivity switching of carbon nanotube fabric 118. The layer to be deposited next is a semiconductor material, such as silicon, typically deposited by a low-pressure chemical vapor deposition (LPCVD) process. Silicon deposited by LPCVD has excellent step coverage, and, if deposited directly on carbon nanotube fabric 118, may tend to infiltrate between the individual carbon nanotubes, changing the composition and behavior of the fabric. Conductive layer 111, formed of a material with poorer step coverage, helps to prevent such infiltration.

Next semiconductor material that will be patterned into pillars is deposited. The semiconductor material can be silicon, germanium, a silicon-germanium alloy, or other suitable semiconductors, or semiconductor alloys. For simplicity, this description will refer to the semiconductor material as silicon, but it will be understood that the skilled practitioner may select any of these other suitable materials instead.

Bottom heavily doped region 112 can be formed by any deposition and doping method known in the art. The silicon can be deposited and then doped, but is preferably doped in situ by flowing a donor gas providing a p-type dopant atoms, for example boron, during deposition of the silicon. In preferred embodiments, the donor gas is $BCl_3$, and p-type region 112 is preferably doped to a concentration of about $1 \times 10^{21}$ atoms/cm$^3$. Heavily doped region 112 is preferably between about 100 and about 800 angstroms thick, most preferably about 200 angstroms thick.

Intrinsic or lightly doped region 114 can be formed next by any method known in the art. Region 114 is preferably silicon and has a thickness between about 1200 and about 4000 angstroms, preferably about 3000 angstroms. The silicon of heavily doped region 112 and intrinsic region 114 is preferably amorphous as deposited.

Semiconductor regions 114 and 112 just deposited, along with underlying conductive layer 111, carbon nanotube fabric 118, and conductive layer 110, will be patterned and etched to form pillars 300. Pillars 300 should have about the same pitch and about the same width as conductors 200 below, such that each pillar 300 is formed on top of a conductor 200. Some misalignment can be tolerated.

Pillars 300 can be formed using any suitable masking and etching process. For example, photoresist can be deposited, patterned using standard photolithography techniques, and etched, then the photoresist removed. Alternatively, a hard mask of some other material, for example silicon dioxide, can be formed on top of the semiconductor layer stack, with bottom antireflective coating (BARC) on top, then patterned and etched. Similarly, dielectric antireflective coating (DARC) can be used as a hard mask.

The photolithography techniques described in Chen, U.S. application Ser. No. 10/728,436, "Photomask Features with Interior Nonprinting Window Using Alternating Phase Shifting," filed Dec. 5, 2003; or Chen, U.S. application Ser. No. 10/815,312, "Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

The diameter of the pillars 300 can be as desired, for example between about 22 nm and about 130 nm, preferably between about 32 nm and about 80 nm, for example about 45 nm. Gaps between pillars 300 are preferably about the same as the diameter of the pillars. Note that when a very small feature is patterned as a pillar, the photolithography process tends to round corners, such that the cross-section of the pillar tends to be circular, regardless of the actual shape of the corresponding feature in the photomask.

Dielectric material 108 is deposited over and between the semiconductor pillars 300, filling the gaps between them. Dielectric material 108 can be any known electrically insulating material, such as silicon oxide, silicon nitride, or silicon oxynitride. In a preferred embodiment, silicon dioxide is used as the insulating material.

Next the dielectric material on top of pillars 300 is removed, exposing the tops of pillars 300 separated by dielectric material 108, and leaving a substantially planar surface. This removal of dielectric overfill can be performed by any process known in the art, such as CMP or etchback. After CMP or etchback, ion implantation is performed, forming heavily doped n-type top regions 116. The n-type dopant is preferably a shallow implant of arsenic, with an implant energy of, for example, 10 keV, and dose of about $3\times10^{15}/$cm$^2$. This implant step completes formation of diodes 302. The resulting structure is shown in FIG. 5b. Fabrication of the p-i-n diode 302 is described in more detail in Herner, U.S. patent Ser. No. 11/692,151, "Method to Form Upward-Pointing P-I-N Diodes Having Large and Uniform Current," filed on even date herewith. Note that some thickness, for example about 300 to about 800 angstroms of silicon is lost during CMP; thus the finished height of diode 302 may be between about 800 and about 4000 angstroms, for example about 2500 angstroms for a diode having a feature size of about 45 nm.

Figure 5C:
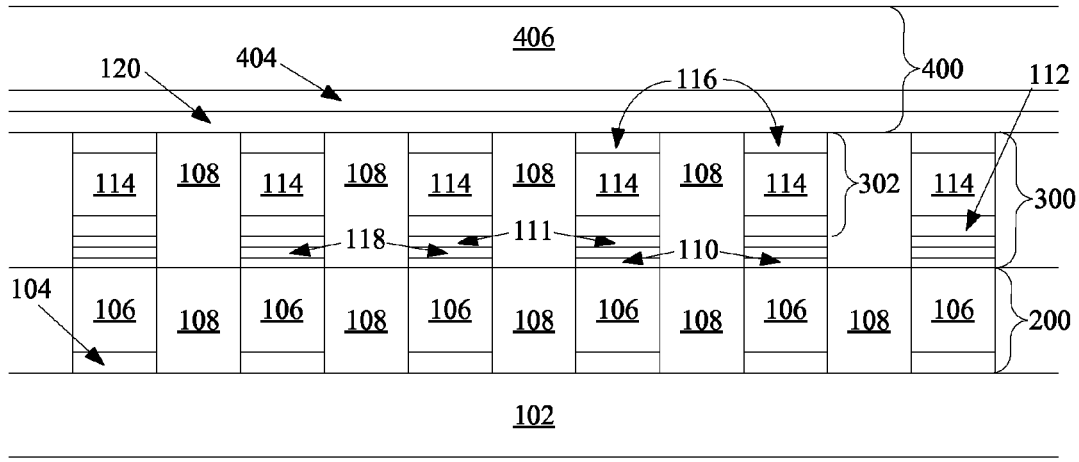

Turning to FIG. 5c, next a layer 120 of a silicide-forming metal, for example titanium, cobalt, chromium, tantalum, platinum, niobium, or palladium, is deposited. Layer 120 is preferably titanium or cobalt; if layer 120 is titanium, its thickness is preferably between about 10 and about 100 angstroms, most preferably about 20 angstroms. Layer 120 is followed by titanium nitride layer 404. Layer 404 is preferably between about 20 and about 100 angstroms, most preferably about 80 angstroms. Next a layer 406 of a conductive material, for example tungsten, is deposited; for example this layer may be about 1500 angstroms of tungsten formed by CVD. Layers 406, 404, and 120 are patterned and etched into rail-shaped top conductors 400, which preferably extend in a direction perpendicular to bottom conductors 200. The pitch and orientation of top conductors 400 is such that each conductor 400 is formed on top of and contacting a row of pillars 300. Some misalignment can be tolerated.

Next a dielectric material (not shown) is deposited over and between conductors 400. The dielectric material can be any known electrically insulating material, such as silicon oxide, silicon nitride, or silicon oxynitride. In a preferred embodiment, silicon oxide is used as this dielectric material.

Referring to FIG. 5c, note that layer 120 of a silicide-forming metal is in contact with the silicon of top heavily doped region 116. During subsequent elevated temperature steps, the metal of layer 120 will react with some portion of the silicon of heavily doped region 116 to form a silicide layer (not shown), which is between the diode and top conductor 400; alternatively this silicide layer can be considered to be part of top conductor 400. This silicide layer forms at a temperature lower than the temperature required to crystallize silicon, and thus will form while regions 112, 114, and 116 are still largely amorphous. If a silicon-germanium alloy is used for top heavily doped region 116, a silicide-germanide layer may form, for example of cobalt silicide-germanide or titanium silicide-germanide.

In the example just described, the diode 302 of FIG. 5c comprises a bottom heavily doped p-type region, a middle intrinsic region, and top heavily doped n-type region. In preferred embodiments, the next memory level to be monolithically formed above this one shares conductor 400 with the first memory level just formed; i.e., the top conductor 400 of the first memory level serves as the bottom conductor of the second memory level. If conductors are shared in this way, then the diodes in the second memory level preferably point the opposite direction, comprising a bottom heavily doped n-type region, a middle intrinsic region, and a top heavily doped p-type region.

Figure 5D:
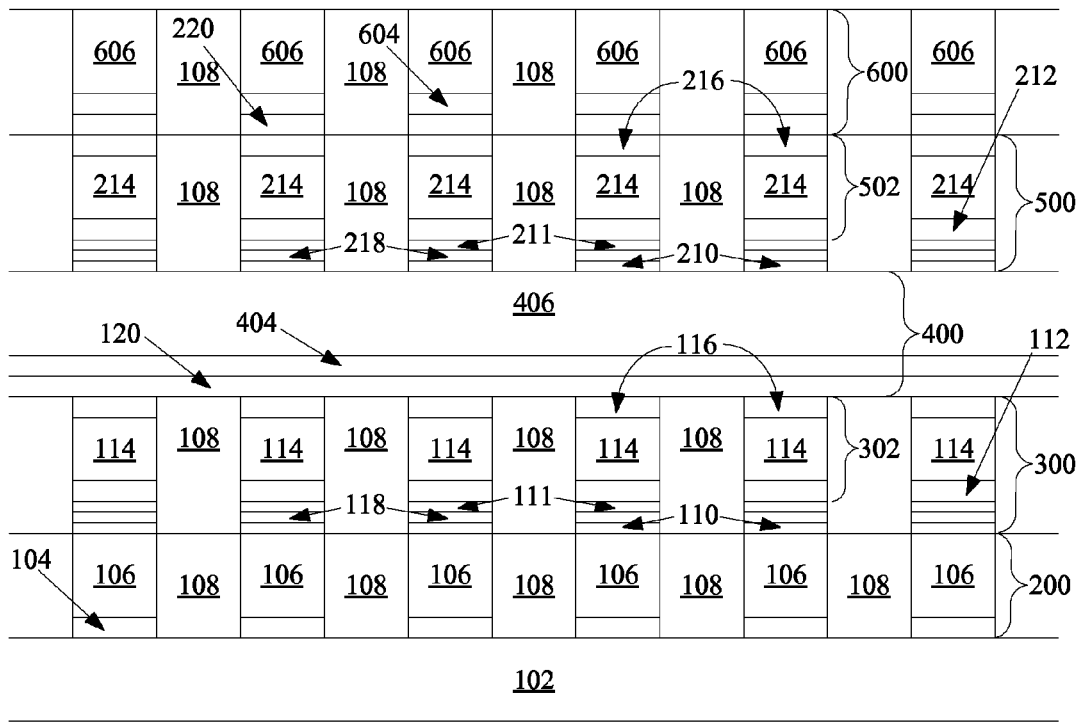

Turning to FIG. 5d, next optional conductive layer 210, carbon nanotube fabric layer 218, and optional conductive layer 211 are formed, preferably of the same materials, the same thicknesses, and using the same methods as layers 110, 118, and 111, respectively, of pillars 300 in the first memory level.

Diodes are formed next. Bottom heavily doped region 212 can be formed by any deposition and doping method known in the art. The silicon can be deposited and then doped, but is preferably doped in situ by flowing a donor gas providing n-type dopant atoms, for example phosphorus, during deposition of the silicon. Heavily doped region 212 is preferably between about 100 and about 800 angstroms thick, most preferably about 100 to about 200 angstroms thick.

The next semiconductor region to be deposited is preferably undoped. In deposited silicon, though, n-type dopants such as phosphorus exhibit strong surfactant behavior, tending to migrate toward the surface as the silicon is deposited. Deposition of silicon will continue with no dopant gas provided, but phosphorus atoms migrating upward, seeking the surface, will unintentionally dope this region. As described in Herner, U.S. patent application Ser. No. 11/298,331, "Deposited Semiconductor Structure to Minimize N-Type Dopant Diffusion and Method of Making," filed Dec. 9, 2005, hereby incorporated by reference, the surfactant behavior of phosphorus in deposited silicon is inhibited with the addition of germanium. Preferably a layer of a silicon-germanium alloy including at least 10 at % germanium is deposited at this point, for example about 200 angstroms of $Si_{0.8}Ge_{0.2}$, which is deposited undoped, with no dopant gas providing phosphorus. This thin layer is not shown in FIG. 5d.

Use of this thin silicon-germanium layer minimizes unwanted diffusion of n-type dopant into the intrinsic region to be formed, maximizing its thickness. A thicker intrinsic region minimizes leakage current across the diode when the diode is under reverse bias, reducing power loss. This method allows the thickness of the intrinsic region to be increased without increasing the overall height of the diode. As will be seen, the diodes will be patterned into pillars; increasing the height of the diode increases the aspect ratio of the etch step forming these pillars and the step to fill gaps between them. Both etch and fill are more difficult as aspect ratio increases.

Intrinsic region 214 can be formed next by any method known in the art. Region 214 is preferably silicon and preferably has a thickness between about 1100 and about 3300 angstroms, preferably about 1700 angstroms. The silicon of heavily doped region 212 and intrinsic region 214 is preferably amorphous as deposited.

Semiconductor regions 214 and 212 just deposited, along with underlying conductive layer 211, carbon nanotube fabric 218, and conductive layer 210, will be patterned and etched to form pillars 500. Pillars 500 should have about the same pitch and about the same width as conductors 400 below, such that each pillar 500 is formed on top of a conductor 400. Some misalignment can be tolerated. Pillars 500 can be patterned and etched using the same techniques used to form pillars 300 of the first memory level.

Dielectric material 108 is deposited over and between the semiconductor pillars 500, filling the gaps between them. As in the first memory level, the dielectric material 108 on top of pillars 500 is removed, exposing the tops of pillars 300 separated by dielectric material 108, and leaving a substantially planar surface. After this planarization step, ion implantation is performed, forming heavily doped p-type top regions 116. The p-type dopant is preferably a shallow implant of boron, with an implant energy of, for example, 2 keV, and dose of about $3\times10^{15}/$cm$^2$. This implant step completes formation of diodes 502. The resulting structure is shown in FIG. 5d. Some thickness of silicon is lost during the CMP step, so he completed diodes 502 have a height comparable to that of diodes 302.

Top conductors 600 are formed in the same manner and of the same materials as conductors 400, which are shared between the first and second memory levels. A layer 220 of a silicide-forming metal is deposited, followed by titanium nitride layer 604 and layer 606 of a conductive material, for example tungsten. Layers 606, 604, and 220 are patterned and etched into rail-shaped top conductors 600, which preferably extend in a direction substantially perpendicular to conductors 400 and substantially parallel to conductors 200.

Preferably after all of the memory levels have been formed, a single crystallizing anneal is performed to crystallize the semiconductor material of diodes 302, 502, and those diodes formed on additional levels, for example at 750 degrees C. for about 60 seconds, though each memory level can be annealed as it is formed. The resulting diodes will generally be polycrystalline. Since the semiconductor material of these diodes is crystallized in contact with a silicide or silicide-germanide layer with which it has a good lattice match, the semiconductor material of diodes 302, 502, etc. will be low-defect and low-resistivity.

In the embodiment just described, conductors were shared between memory levels; i.e. top conductor 400 of the first memory level serves as the bottom conductor of the second memory level. In other embodiments, an interlevel dielectric (not shown) is formed above the first memory level of FIG. 5c, its surface planarized, and construction of a second memory level begins on this planarized interlevel dielectric, with no shared conductors. In the example given, the diodes of the first memory level were downward-pointing, with p-type silicon on the bottom and n-type on top, while the diodes of the second memory level were reversed, pointing upward with n-type silicon on the bottom and p-type on top. In embodiments in which conductors are shared, diode types preferably alternate, upward on one level and downward on the next. In embodiments in which conductors are not shared, diodes may be all one type, either upward- or downward-pointing. The terms upward and downward refer to the direction of current flow when the diode is under forward bias.

In the embodiment just described, referring to FIG. 5d, in the first memory level carbon nanotube fabric 118 was disposed between diode 302 and bottom conductor 200; and, in the second memory level, between diode 502 and bottom conductor 400. In other embodiments, the carbon nanotube fabric element may be disposed between a vertically oriented diode and a top conductor.

In some embodiments, it may be preferred for the programming pulse to be applied with the diode in reverse bias. This may have advantages in reducing or eliminating leakage across the unselected cells in the array, as described in Kumar et al., U.S. patent application Ser. No. 11/496,986, "Method For Using A Memory Cell Comprising Switchable Semiconductor Memory Element With Trimmable Resistance," filed Jul. 28, 2006, owned by the assignee of the present invention and hereby incorporated by reference.

To summarize, what has been described is a first memory level monolithically formed above a substrate, the first memory level comprising: i) a plurality of first substantially parallel, substantially coplanar bottom conductors; ii) a plurality of steering elements; iii) a plurality of first-level carbon nanotube fabric elements, and iv) a plurality of first substantially parallel, substantially coplanar top conductors; and v) a plurality of first-level memory cells, wherein each first-level memory cell comprises one of the steering elements and one of the first-level carbon nanotube fabric elements arranged electrically in series between one of the first bottom conductors and one of first top conductors; and (b) a second memory level monolithically formed above the first memory level.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

An alternative method for forming a similar array in which conductors are formed using Damascene construction is described in Radigan et al., U.S. patent application Ser. No. 11/444,936, "Conductive Hard Mask to Protect Patterned Features During Trench Etch," filed May 31, 2006, assigned to the assignee of the present invention and hereby incorporated by reference. The methods of Radigan et al. may be used instead to form an array according to the present invention. In the methods of Radigan et al., a conductive hard mask is used to etch the diodes beneath them. In adapting this hardmask to the present invention, in preferred embodiments the bottom layer of the hard mask, which is in contact with the silicon of the diode, is preferably titanium, cobalt, or one of the other silicide-forming metals mentioned earlier. During anneal, then, a silicide forms, providing the silicide crystallization template mentioned earlier.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A memory cell comprising:
   a first conductor;
   a steering element, wherein the steering element is a vertically oriented p-i-n junction diode;
   a carbon nanotube fabric; and
   a second conductor,
   wherein the steering element and the carbon nanotube fabric are arranged electrically in series between the first conductor and the second conductor, and
   wherein the entire memory cell is formed above a substrate.

2. The memory cell of claim 1 wherein the substrate comprises monocrystalline silicon.

3. The memory cell of claim 1 wherein the second conductor is above the first conductor, the diode and the carbon nanotube fabric disposed between them.

4. The memory cell of claim 3 wherein the carbon nanotube fabric is disposed between and permanently in contact with first and second metal or metallic elements.

5. The memory cell of claim 4 wherein the first or second metal or metallic elements comprise titanium nitride, tantalum nitride, or tungsten.

6. The memory cell of claim 4 wherein the first metal or metallic element is below and permanently in contact with the carbon nanotube fabric and the second metal or metallic element is above and permanently in contact with the carbon nanotube fabric.

7. The memory cell of claim 3 further comprising a silicide layer disposed between the second conductor and the diode.

8. The memory cell of claim 7 wherein the silicide layer is titanium silicide or cobalt silicide.

9. The memory cell of claim 8 wherein the second conductor comprises a bottom layer, wherein the bottom layer is titanium or cobalt.

10. The memory cell of claim 3 wherein the carbon nanotube fabric is disposed between the first conductor and the diode.

11. The memory cell of claim 1 wherein the diode comprises a bottom heavily doped n-type region, a middle intrinsic or lightly doped region, and a top heavily doped p-type region.

12. The memory cell of claim 11 wherein the middle intrinsic or lightly doped region comprises a layer of silicon-germanium.

13. The memory cell of claim 12 wherein the layer of silicon-germanium is at least 10 at % germanium.

14. The memory cell of claim 1 wherein the data state of the memory cell is stored in a resistivity state of the carbon nanotube fabric.

15. A monolithic three dimensional memory array comprising:
   (a) a first memory level monolithically formed above a substrate, the first memory level comprising:
      (i) a plurality of first substantially parallel, substantially coplanar bottom conductors;
      (ii) a plurality of steering elements;
      (iii) a plurality of first-level carbon nanotube fabric elements, and
      (iv) a plurality of first substantially parallel, substantially coplanar top conductors; and
      (v) a plurality of first-level memory cells, wherein each first-level memory cell comprises one of the steering elements and one of the first-level carbon nanotube fabric elements arranged electrically in series between one of the first bottom conductors and one of first top conductors; and
   (b) a second memory level monolithically formed above the first memory level.

16. The monolithic three dimensional memory array of claim 15 wherein the substrate comprises monocrystalline silicon.

17. The monolithic three dimensional memory array of claim 15 wherein each of the steering elements is a first-level junction diode.

18. The monolithic three dimensional memory array of claim 17 wherein each of the steering elements is a first-level p-i-n diode.

19. The monolithic three dimensional memory array of claim 18 wherein each first-level p-i-n diode is vertically oriented.

20. The monolithic three dimensional memory array of claim 19 wherein, in each first-level memory cell, the first top conductor is above the first bottom conductor.

21. The monolithic three dimensional memory array of claim 20 wherein each first-level memory cell further comprises a silicide layer disposed between the one of the first top conductors and one of the first-level p-i-n diodes.

22. The monolithic three dimensional memory array of claim 21 wherein the silicide layer is titanium silicide or cobalt silicide.

23. The monolithic three dimensional memory array of claim 22 wherein each of the first top conductors comprises a bottom layer, wherein the bottom layer is titanium or cobalt.

24. The monolithic three dimensional memory array of claim 20 wherein each of the carbon nanotube fabric elements is disposed between one of the first bottom conductors and one of the first-level p-i-n diodes.

25. The monolithic three dimensional memory array of claim 18 wherein each of the first-level p-i-n diodes comprises a bottom heavily doped n-type region, a middle intrinsic or lightly doped region, and a top heavily doped p-type region.

26. The monolithic three dimensional memory array of claim 15 wherein the second memory level comprises a plurality of second-level memory cells, each second-level memory cell comprising a second-level p-i-n diode, each second-level p-i-n diode comprising a bottom heavily doped p-type region, a middle intrinsic or lightly doped region, and a top heavily doped n-type region.

27. The monolithic three dimensional memory array of claim 26 wherein the second memory level further comprises a second plurality of bottom conductors and a second plurality of top conductors, each of the second-level p-i-n diodes disposed between one of the second bottom conductors and one of the second top conductors, and wherein the bottom conductors of the second memory level and the top conductors of the first memory level are shared.

28. The monolithic three dimensional memory array of claim 18 wherein each of the first-level p-i-n diodes comprises a bottom heavily doped p-type region, a middle intrinsic or lightly doped region, and a top heavily doped n-type region.

29. The monolithic three dimensional memory array of claim 28 wherein the second memory level comprises a plurality of second-level memory cells, each second-level memory cell comprising a second-level p-i-n diode, each second-level p-i-n diode comprising a bottom heavily doped n-type region, a middle intrinsic or lightly doped region, and a top heavily doped p-type region.

* * * * *